(12) United States Patent
Liu et al.

(10) Patent No.: US 9,524,365 B1
(45) Date of Patent: Dec. 20, 2016

(54) EFFICIENT MONTE CARLO FLOW VIA FAILURE PROBABILITY MODELING

(71) Applicant: Cadence Design Systems, Inc., San Jose, CA (US)

(72) Inventors: Hongzhou Liu, Sewickley, PA (US); Wangyang Zhang, Allison Park, PA (US)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 14/581,958

(22) Filed: Dec. 23, 2014

(51) Int. Cl.
*G06F 17/50* (2006.01)

(52) U.S. Cl.
CPC .................... *G06F 17/5081* (2013.01)

(58) Field of Classification Search
USPC .......................................... 716/56
See application file for complete search history.

(56) References Cited

U.S. PATENT DOCUMENTS

| | | |
|---|---|---|
| 7,712,055 B2 | 5/2010 | Liu et al. |
| 8,195,427 B2 | 6/2012 | Tiwary et al. |
| 8,219,355 B2 | 7/2012 | Tiwary et al. |
| 8,479,126 B1 | 7/2013 | Liu et al. |
| 8,589,852 B1 | 11/2013 | Liu et al. |
| 8,954,908 B1 | 2/2015 | Liu et al. |
| 8,954,910 B1 | 2/2015 | Liu et al. |
| 2009/0248387 A1* | 10/2009 | Singhee ............... G06F 17/5036 703/16 |
| 2013/0226544 A1* | 8/2013 | Mcconaghy ........ G06F 17/5022 703/2 |
| 2013/0246986 A1* | 9/2013 | Kuo ..................... G06F 17/5036 716/106 |
| 2013/0304439 A1* | 11/2013 | Van der Velden .. G06F 17/5009 703/6 |

OTHER PUBLICATIONS

C. J. Clopper, E.S. Pearson, "The Use of Confidence or Fiducial Limits Illustrated in the Case of the Binomial", Biometrika, vol. 26, No. 4, (Dec. 1934), pp. 404-413.

(Continued)

*Primary Examiner* — Mohammed Alam
(74) *Attorney, Agent, or Firm* — Andrews Kurth Kenyon LLP

(57) ABSTRACT

A system, method, and computer program product for automatically reducing the number of Monte Carlo simulation samples required to determine if a design yield is above or below a given yield target with a given confidence. Embodiments perform an initial Monte Carlo based performance modeling using an initial set of statistical samples, and estimate the failure probability of each of the remaining statistical samples based on the performance model. Embodiments then simulate each of the remaining statistical samples with a computer-operated Monte Carlo circuit simulation tool in decreasing failure probability order, wherein the sample most likely to fail is simulated first. Progressive comparisons of the simulated yield against a yield target eventually verify the yield at a required confidence level, halting the simulation and triggering tangible output of the comparison results. A potential ten-fold decrease in overall yield verification time without loss of accuracy may result.

20 Claims, 4 Drawing Sheets

(56) References Cited

OTHER PUBLICATIONS

Rasit Onur Topaloglu, "Early, Accurate and Fast Yield Estimation through Monte Carlo-Alternative Probabilistic Behavioral Analog System Simulations", Proceedings of the 24th IEEE VLSI Test Symposium (VTS'06), 2006, pp. 138-142.
Chenjie Gu, Jaijeet Roychowdhury, "An Efficient, Fully Nonlinear, Variability-Aware non-Monte-Carlo Yield Estimation Procedure with Applications to SRAM cells and Ring Oscillators", Proceedings of the 2008 Asia and South Pacific Design Automation Conference (AS-DAC'08), 2008, pp. 754-761.
Shupeng Sun, Xin Li, Hongzhou Liu, Kangsheng Luo and Ben Gu, "Fast Statistical Analysis of Rare Circuit Failure Events via Scaled-Sigma Sampling for High-Dimensional Variation Space", Proceedings of the International Conference on Computer-Aided Design (ICCAD'13), 2013, pp. 478-485.

\* cited by examiner

EFFICIENT MONTE CARLO FLOW VIA FAILURE PROBABILITY MODELING

CROSS-REFERENCE TO RELATED APPLICATIONS

This application is related to commonly-assigned patent application U.S. Ser. No. 13/830,696 entitled "COMPUTING DEVICE MISMATCH VARIATION CONTRIBUTIONS", filed on Mar. 14, 2013 (issued as U.S. Pat. No. 8,813,009 on Aug. 19, 2014), and U.S. Ser. No. 14/166,119 entitled "DEVICE MISMATCH CONTRIBUTION COMPUTATION WITH NONLINEAR EFFECTS", filed on Jan. 28, 2014. Both these related applications are hereby incorporated by reference in their entirety.

FIELD OF THE INVENTION

This description relates to the field of circuit simulation, and more precisely to reducing the number of Monte Carlo simulation samples required to determine if a design yield is above or below a given yield target with a given confidence.

BACKGROUND

The goals of integrated circuit design are not only to create a nominal circuit design that meets some predetermined specifications, but also to ensure that the circuit design can be manufactured reliably. Numerous sources of variation may cause some instances of a manufactured circuit design (e.g., fully simulated or fabricated microchips) to fail, that is, to not achieve at least one of the predetermined specifications. (Quite often, "testing" actually refers to full simulation prior to actual fabrication; that nomenclature is adopted in this description for simplicity.) Designers therefore seek to model such variation to estimate and reduce the susceptibility of manufactured designs to such failure.

Many methodologies fix modeling variation are known in the art, including but not limited to those described in the related applications previously incorporated by reference. Once an acceptably accurate variation model or "performance model" for a manufacturing process has been established, a number of Monte Carlo test samples may be selected according to the performance model and simulated to determine if particular design instances will fail. Even with recent advances in simulation technology however, performing a large number of Monte Carlo simulation runs of a design may still be computationally expensive.

When the performance model is sufficiently accurate, the design for manufacturability problem often shifts from estimating a yield to determining if the yield is above or below a yield target with a particular level of confidence. Monte Carlo simulation is therefore often used with a significance test, to check if a design's yield is above or below a particular yield target y with a confidence level c. Higher confidence levels denote an increased sureness that a particular outcome is not due to chance.

When a yield target is high, verifying the yield requires a large number of samples when the actual yield is above or only slightly below the target yield. For example, a three-sigma Gaussian process corresponds to only a 0.13% probability of a failure occurring. Thus, because failures are so rare for such processes, many samples that do not fail will occur before one that does fail. If the actual yield of a manufactured design is one, so no failures ever actually occur, verifying that the yield exceeds the three-sigma level, e.g., 99.87%, requires the following approximate number of samples for the confidence levels shown:

| CONFIDENCE LEVEL | NUMBER OF SAMPLES |
| --- | --- |
| 80% | 1200 |
| 90% | 1700 |
| 95% | 2200 |

Thus, there is a need for an improved approach to reducing the number of Monte Carlo simulation samples required to compare a yield to a target yield with a particular confidence. Accordingly, the inventors have developed a novel way to help circuit designers and design tool vendors address this issue.

DETAILED DESCRIPTION

Figure 1:
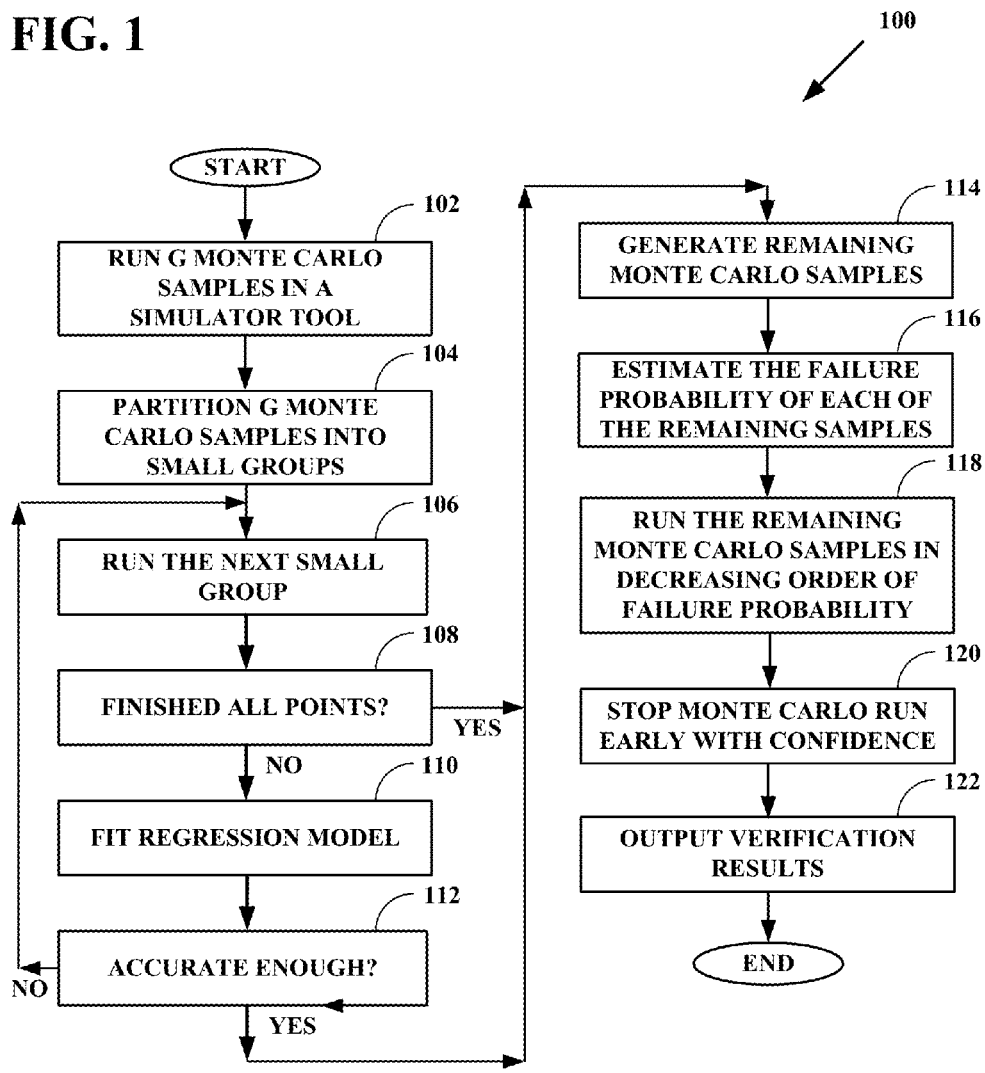
FIG. 1 is a flowchart of an efficient predictive Monte Carlo yield validation flow 100, according to an embodiment.

This description presents a system, method, and computer program product for automatically reducing the number of Monte Carlo simulation samples required to determine if a design yield is above or below a given yield target with a given confidence. Although this description is written in terms of integrated circuit design, the invention is not limited to that application, but may be applicable to any statistically characterized process where failures may occur.

In situations where a process yield is high and a large number of non-failing design instances must be tested before finding a relatively small number of failing design instances, the most efficient way to count the failing instances would be to have them all occur first. Counting the non-failing instances after enough failing instances have been counted to determine if a yield target has been met or not would essentially be a waste of computational effort and thus ideally avoided. Such a happy coincidental outcome is normally very unlikely of course, since the particular variations that cause failures are so rare. For example, failures might occur only when multiple factors are each at an extremely unusual value in some particular combination, e.g., at so-called "worst case corners".

Embodiments of the present invention however deliberately arrange for the failing instances to be far more likely to occur first in a number of samples to be tested. The result may be a remarkable decrease in the overall number of instances that must be tested to verify (e.g., prove or disprove) that a yield target will be met at a predetermined confidence level. A corresponding decrease in the overall computational expense of such yield verification, nearly ten-fold in some test cases, may also be provided.

The overall methodology has three major aspects. First, embodiments may perform an initial Monte Carlo simulation of the design to build a performance model. Constructing the performance model may consume a predetermined portion of a total number of budgeted simulations, e.g., twenty-five percent. Any known method of building a performance model for a statistically varying process may be considered within the scope of the present invention. Some embodiments may employ the methodologies described in the related applications previously incorporated by reference.

Second, embodiments may estimate the failure probability of each of the remaining samples based on the performance model. That is, if a production process is relatively well characterized by the performance model, then that performance model may be relied on to accurately predict which of the future test samples will actually be failures. For example, the performance model may recognize when multiple important factors are at extremely unusual value combinations that have been correlated with failures. Embodiments thus capitalize on the computational investment required to build a performance model by using its predictions to minimize larger future computational expenses.

Third, embodiments may simulate the remaining samples in an order determined by the failure probability predicted by the performance models. The probability of finding the few samples that will fail before going through many samples that will not fail may be greatly increased by first testing those statistical samples that are deemed most likely to fail. Thus, the better the performance model tracks the actual process variation, the greater the chance that failing instances will be predicted and tested first, and thus the greater the chance of an early yield verification.

FIG. 1 shows a flowchart of an efficient predictive Monte Carlo yield validation flow 100, according to an embodiment. The different aspects of the overall methodology are now described in more detail in terms of particular method steps in this figure. In this embodiment, an initial number G of Monte Carlo samples may be simulated as a first step 102 in developing a performance model for the manufacturing process.

At 104, the G Monte Carlo samples may be partitioned into a number of small groups, e.g., four. A number of these groups may then be used as needed for developing the performance model that is deemed to be sufficiently accurate. In one embodiment, the development of the performance model may follow the methodologies of at least one of the previously incorporated applications. Broadly speaking, those methodologies may estimate whether a fitted model is sufficiently accurate, and may selectively increase model complexity to achieve sufficient accuracy.

Briefly, the performance model may be developed in one embodiment by following the left side of the FIG. 1 flowchart. The performance model development flow of this embodiment involves iteratively fitting points from one of the small group of samples to a regression model (at 110), determining if the regression model is sufficiently accurate (at 112), and if not then using another small group of samples to improve the regression model as needed (at 106). If all the points of a small group of samples allocated for development are used, the performance model development process may end (at 108). That is, the performance model may be as good as it can get for the available data budget. However, if the regression model is deemed sufficiently accurate before all the allocated points are used, the performance model development process may end early, e.g., without using either additional points or another of the small groups of samples (again, at 112). Embodiments of the accuracy-based automatic stop feature shown in FIG. 1 item 112 are described in more detail in the previously incorporated related applications, but essentially they estimate accuracy as a logarithmic function of the number of input data samples and mismatch parameters, and selectively increase regression model complexity as needed.

The total number of Monte Carlo samples allocated for the entire methodology includes the samples to be potentially used for performance model development and the remaining samples to be potentially used for testing the predicted failures. The total number of samples may be approximated from an estimate of the yield of the modeled process (or, alternatively, the yield target to be verified, if comparable) and the confidence level at which the yield is to be compared to the yield target.

The total number of samples may also be limited by the time and computational resources available. However, as noted above the performance model development process may finalize after requiring far fewer than G samples to achieve sufficient accuracy. The checking of the predicted failures may also finalize early, as will be described. Early process halting for either case may thus speed the end result of the yield verification process well beyond conventional brute force methods.

The next two aspects, arranging the samples in failure probability order and conducting predictive testing for design failures, may begin once a sufficiently accurate performance model is available to reliably estimate whether a particular Monte Carlo sample will result in a design failure when simulated. At 114, embodiments may generate the remaining Monte Carlo samples to be used for predictive testing. That is, a set of input factors may be chosen to create a representative population of design instances that would result from an actual simulation (or production) run.

At 116, embodiments may estimate the failure probability of each of the remaining samples according to the performance model. For a well-behaved process, the failure probability for nearly all samples will be very low, with only a few if any samples categorized as a failure. Expressed in more topological terms, the failure subspace may be a very small subset of the overall possible result space. The boundary between the failing and non-failing regions may be numerically very steep indeed, with only tiny changes to various input factors having potentially immense relative influence. Embodiments may then sort the remaining samples in a probability of failure order, with the most likely to fail samples listed first.

At 118, embodiments may fully simulate the remaining Monte Carlo samples in the decreasing order of failure probability. During simulation of each sample (though noted as a separate step 120 in FIG. 1), embodiments may perform a comparison between the simulated yield and the input yield target. If the yield has been verified, e.g. the yield has either met the yield target or has not met the yield target, with a required confidence level, embodiments may halt the simulation process. For example, if a significance test requires only two failures in a given number of tests to confidently prove that a yield target cannot be met, when those two failures occur there is little need to look for additional failures.

At 122, embodiments may output the verification results. The results may confirm that a yield target has been met at the required confidence level, or may confirm that a yield target has not been met at the required confidence level. However, the results may also denote that no yield verification is possible at the required confidence level, even when all of the allocated samples have been exhausted. This outcome may be due to a number of causes, including too few samples for the performance model development, too few samples for the predictive testing, and/or an overly high required confidence level.

After the initial Monte Carlo simulation, each design specification $y_i$ may be approximated by a model, $$y_i = f_i(x) + \epsilon_i \quad \text{(Eqn. 1)}.$$

where x represents all statistical parameters, $f_i(x)$ is a linear, quadratic, or higher order function of a response surface methodology fit automatically, and $\epsilon_i$ is a random error term. The error term $\epsilon_i$ may be modeled by a standard normal distribution, $$\epsilon_i \sim N(0, \sigma_i^2) \quad \text{(Eqn. 2)}.$$

which is the Bayesian interpretation of a model fitting that minimizes the L2-norm of the residual. For any parameter set $x_j$, the actual performance $y_{ij}$ thus satisfies the distribution $$y_{ij} \sim N(f_i(x_j), \sigma_i^2) \quad \text{(Eqn. 3)}.$$

Figure 2:
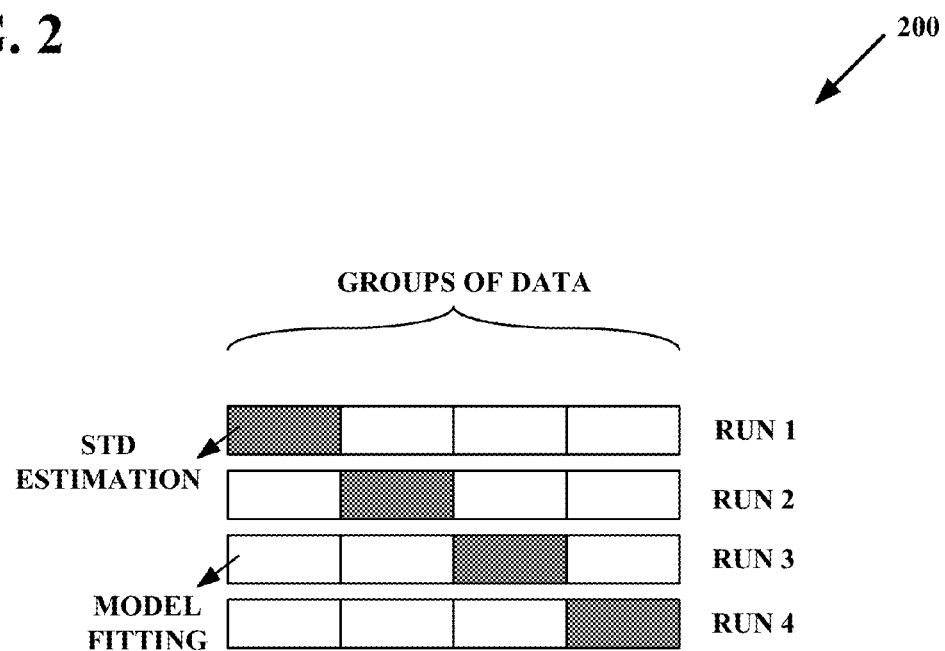
FIG. 2 is a diagram of a data grouping 200 for cross-validation, according to an embodiment.

FIG. 2 shows a diagram of a data grouping 200 for cross-validation, according to an embodiment. In this embodiment, the standard deviation $\sigma_i$ may be estimated by cross-validation. Data from the completed Monte Carlo simulations may be divided into four exemplary groups used for verifying the regression model's standard deviation estimate and for actual regression model fitting. In each of the exemplary four separate simulation runs, a different data group may be used for independent standard deviation estimation (shown in gray), while the remaining data groups may be used for the model fitting. Each of the four exemplary simulation runs will thus have its own particular residual, and the standard deviation may be estimated as $$\sigma_i = std(\{residual_1, residual_2, residual_3, residual_4\}) \quad \text{(Eqn. 4)}.$$

Use of four to ten separate simulation runs may be typical to reasonably trade off between achieving a consistent $\sigma_i$ estimate and computational cost. The estimated value of $\sigma_i$ is typically larger than the true $\sigma_i$, since for an F-fold cross-validation, the error is estimated by only an (F−1)/F portion of the data. The cross-validation process may be repeated on additional data as needed, until sufficient model accuracy is achieved.

Further detail is now provided regarding the second aspect of the methodology, the sample reordering following performance model development. Embodiments first generate statistical parameter values $\{x_1, x_2, \ldots, x_M\}$ for each of the remaining unsimulated samples. Embodiments then rank the samples by failure probability, which may be defined as the probability for each design specification i to stay within its target $t_j$ $$P_j(\text{fail}) = 1 - P(y_{1j} < t_1, y_{2j} < t_2, y_{Nj} < t_n) \quad \text{(Eqn. 5)}.$$

Assuming independence between the design specifications, this expression may be rewritten as $$P_j(\text{fail}) = 1 - \prod_{i=1}^{N} P(y_{ij} < t_i). \quad \text{(Eqn. 6)}$$

As a practical matter, $P_j(\text{fail})$ may be a number that is extremely close to either zero or one, meaning that a particular sample may either be extremely likely to meet its design goals or extremely likely not to meet its design goals. These value ranges make the probability difficult or impossible to be adequately represented within the limits of a double precision variable. One embodiment may therefore employ a logarithmic cost function for improved representation, $$C_j = -\log\left(\prod_{i=1}^{N} P(y_{ij} < t_i)\right) = -\sum_{i=1}^{N} \log(P(y_{ij} < t_i)). \quad \text{(Eqn. 7)}$$

The sample ordering using this cost function is the same as the order when directly using the failure probability.

Since $y_{ij} \sim N(f_i(x_j), \sigma_i^2)$ each term $\log(P(y_{ij} < t_i))$ may be estimated by $$\log(P(y_{ij} < t_i)) = \log\left(CDF\left(\frac{t_i - f_i(x_j)}{\sigma_i}\right)\right). \quad \text{(Eqn. 8)}$$

where CDF denotes the standard normal cumulative distribution function. Let $$d_{ij} = (t_i - f_i(x_j))/\sigma_i \quad \text{(Eqn. 9)}.$$

Equation 8 may then be rewritten as:

$$\log(P(y_{ij} < t_i)) = \log\left(\frac{1}{2}\left(1 + erf\left(\frac{d_{ij}}{\sqrt{2}}\right)\right)\right) \quad \text{(Eqn. 10)}$$

where erf is the error function. Depending on the value of $d_{ij}$, the computation of $\log(P(y_{ij} < t_i))$ may need to be performed differently due to the double precision representational limit. When $d_{ij} < 0$, $$\log(P(y_{ij} < t_i)) = \log\left(\frac{1}{2} erfc\left(\frac{-d_{ij}}{\sqrt{2}}\right)\right) \quad \text{(Eqn. 11)}$$

where erfc is the complementary error function. The use of the erfc based equation avoids the cancellation error when $d_{ij}$ is very small and the erf function is very close to −1. When $d_{ij} > 0$ but is not very large, the original Equation 10 may be used. When $d_{ij}$ is very large (e.g., >8), $P(y_{ij} < t_i)$ becomes extremely close to one and precision may be lost in the log computation. In that situation, embodiments may calculate the following expression based on a Taylor expansion:

$$\log(P(y_{ij} < t_i)) = \log(1 - P(y_{ij} < t_i)) \approx -P(y_{ij} < t_i) = \quad \text{(Eqn. 12)}$$

$$p(y_{ij} < t_i) - 1 = \frac{1}{2}\left(1 + erf\left(\frac{d_{ij}}{\sqrt{2}}\right)\right) - 1 =$$

$$\frac{1}{2}\left(erf\left(\frac{d_{ij}}{\sqrt{2}}\right) - 1\right) = -\frac{1}{2} erfc\left(\frac{d_{ij}}{\sqrt{2}}\right).$$

Implementation of the cost function as described above best utilizes the double precision representational limit in most cases. However, the limit will still be hit when abs$(d_{ij}) > 37$, such that the cost functions will not be precisely comparable. The particular ordering may be of limited practical interest to users when comparing data points that have over thirty-seven sigma probability to pass or fail. Nonetheless, a second cost function is now provided to sort the samples when the first cost function evaluates as the same.

Consider the first cost function of Equation 7, $$C_j = -\sum_{i=1}^{N} \log(P(y_{ij} < t_i))$$

and assume that the failure probability is dominated by one of the design specifications, $$C_j \approx \max_i \left( -\log \left( P(y_{ij} < t_i) \right) \right) = -\min_i \left( \log \left( P(y_{ij} < t_i) \right) \right) \quad \text{(Eqn. 13)}.$$

This expression is equivalent to the following cost function, $$C'_j = -\min_i(d_{ij}) \quad \text{(Eqn. 14)}$$

The second cost function thus relies on an additional approximation, but does not have numerical representation issues, since it compares probabilities directly in terms of sigma.

Further detail is now provided regarding the third aspect of the methodology, the conducting of predictive failure sample simulation and yield validation. Embodiments may advantageously stop the Monte Carlo simulation of the remaining samples when the yield is found to be lower or higher than the target yield, at the required confidence level c. Embodiments may therefore directly apply a significance test to determine if the yield is lower than the target yield. As previously noted, this approach requires far fewer samples than the same significance test with a normal brute force Monte Carlo process, since the samples that are more likely to fail are simulated first.

To verify if the yield is higher than the target yield, embodiments may estimate the expected number of failures in the unsimulated samples, $$E_{fail} = \sum_{i=1}^{N} i \cdot P(\# \text{ fails} = i). \quad \text{(Eqn. 15)}$$

The probability P(#fails=i) may be estimated from the cost functions, e.g., $$P(\# \text{ fails} = 0) = \prod_{j=1}^{M} \prod_{i=1}^{N} P(y_{ij} < t_i) y_{ij} < t_i = \exp\left(-\sum_{j=1}^{M} C_j\right) \quad \text{(Eqn. 16)}$$

and $$P(\# \text{ fails} = 1) = \quad \text{(Eqn. 17)}$$

$$\sum_{k=1}^{M} \left( \left(1 - \prod_{i=1}^{N} P(y_{ik} < t_i)\right) \prod_{j=1, j \neq k}^{M} \prod_{i=1}^{N} P(y_{ij} < t_i) \right) = \sum_{k=1}^{M} \left( \exp\left(-\sum_{j=1, j \neq k}^{M} C_j\right) - \exp\left(-\sum_{j=1}^{M} C_j\right) \right).$$

When $E_{fail} < 1-c$, the confidence interval lower bound may be estimated by assuming that all samples are simulated, and the number of failures is ($M_{fail} + E_{fail}$), where $M_{fail}$ is the number of failed simulated samples. When the lower bound is higher than then the yield target, simulation may be halted. Since c is a number close to 1, P(#fails=0)>>P(#fails=1)>>P(#fails=2), etc., so only the first few elements need to be estimated for $E_{fail}$. Since the estimated model error by cross-validation is typically larger than the true error, $E_{fail}$ is typically an over-estimation of the true number of fails, so it would be unlikely that simulations would stop too early.

Experiments were performed on an exemplary two-stage operational amplifier designed in a typical forty-five nm process. Four performance specifications were measured, including current, unity gain frequency, gain, and random offset. The test objective is to verify the circuit has a 99.87% yield with 90% confidence.

The experiments indicated that the operational amplifier design has a high yield, but less than 99.87%. While normal yield verification processes would require approximately 500 runs to verify the yield is less than 99.87%, embodiments tested were able to find enough failure samples to stop the simulations at only 58 points.

After the design was configured to have a very large yield, the tests were repeated. While normal yield verification processes would require approximately 1700 runs to verify the yield is greater than 99.87%, embodiments tested were able to confirm the yield is higher than 99.87% with only 60 points.

Figure 3:
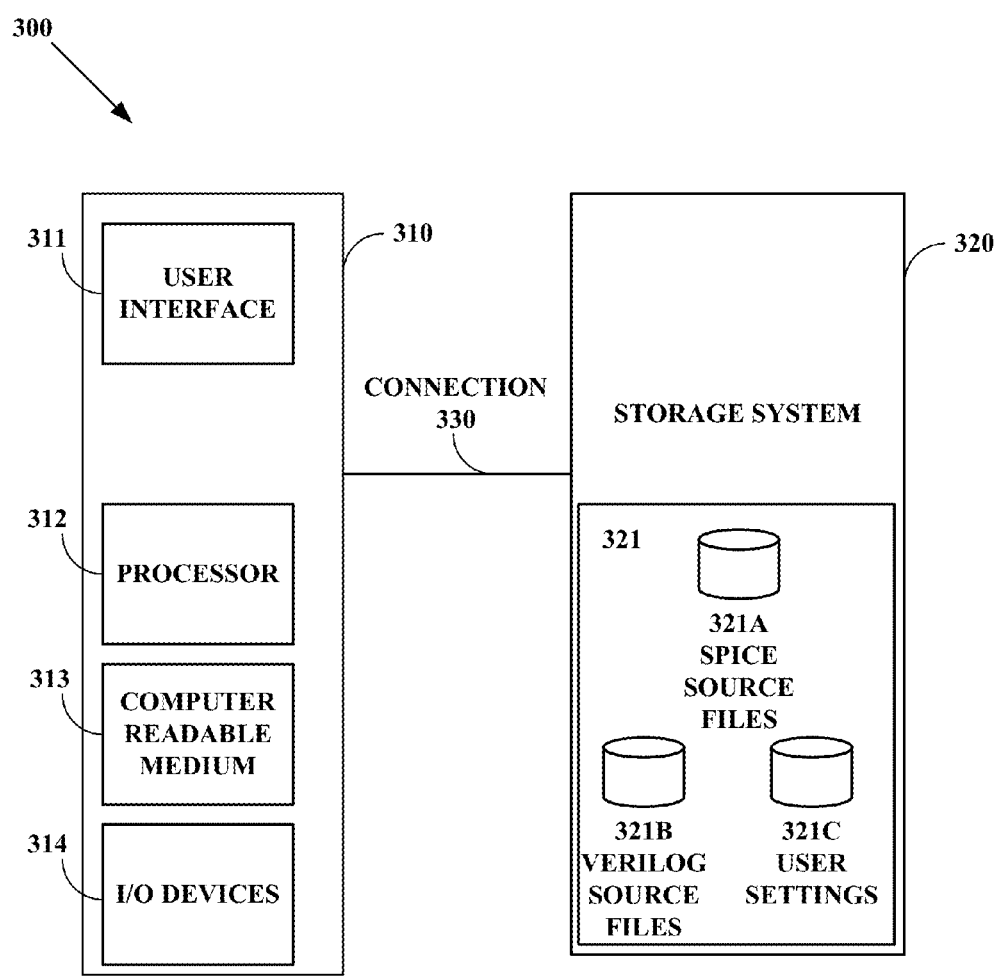
FIG. 3 is a block diagram of a circuit analysis system 300, according to an embodiment.

FIG. 3 shows a block diagram of an exemplary circuit analysis system 300, according to an embodiment. This system may provide simulator functionality for any of the methods described above. A user may access the system 300 through a standalone client system, client-server environment, or a network environment. System 300 may comprise one or more clients or servers 310, one or more storage systems 320, and a connection or connections 330 between and among these elements.

Client 310 may execute instructions stored on transitory or non-transitory computer readable medium 313 with processor 312, and may provide a user interface 311 to allow a user to access storage system 320. The instructions may be part of a software program or executable file that may operate electronic design automation (EDA) software. Client 310 may be any computing system, such as a personal computer, workstation, mobile computer, or other device employing a processor which is able to execute programming instructions. User interface 311 may be a GUI run in a user-controlled application window on a display. A user may interact with user interface 311 through one or more input/output (I/O) devices 314 such as a keyboard, a mouse, or a touch screen.

Storage system 320 may take any number of forms, including but not limited to a server with one or more storage devices attached to it, a storage area network, or one or a plurality of non-transitory computer readable media. Databases 321 may be stored in storage system 320 such that they may be persistent, retrieved, or edited by the user. Databases 321 may include SPICE source files 321A, Verilog source files 321B, and a user input database 321C for example. These databases may be kept as separate files or systems, or may be merged together in any appropriate combination.

Only one client 310 is shown connected to storage system 320 through connection 330, which may be a simple direct wired or wireless connection, a system bus, a network connection, or the like, to provide client 310 with access to storage system 320. In another aspect, connection 330 may enable multiple clients 310 to connect to storage system 320. The connection may be part of a local area network, a wide area network, or another type of network, again providing one or more clients with access to storage system 320. Depending on system administrator settings, client 310's access to system storage 320 or to other clients may be limited.

Figure 4:
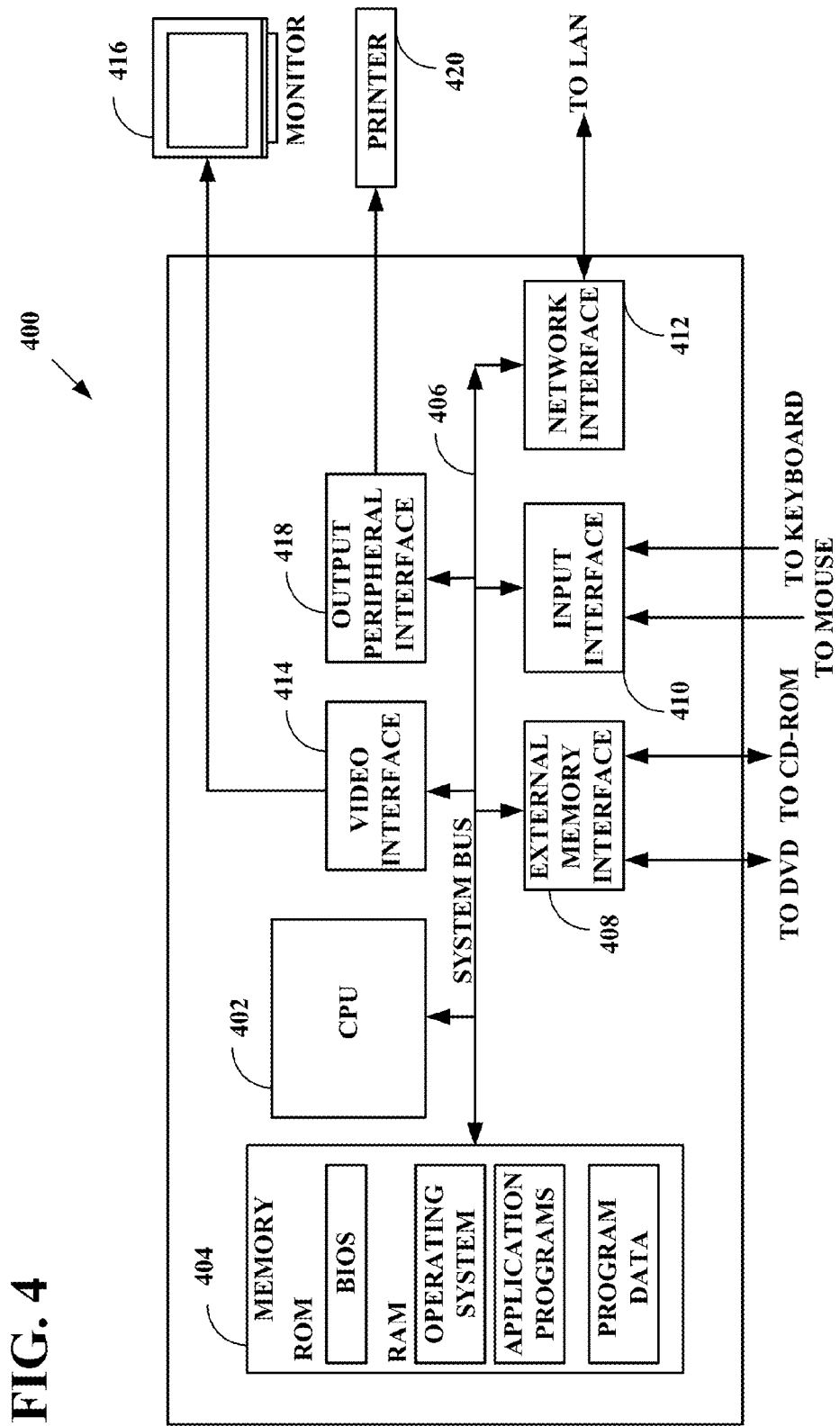
FIG. 4 is a diagram of a computer system 400, according to an embodiment.

FIG. 4 depicts an exemplary computer system comprising the structure for implementation of embodiments described above. Computer system 400 comprises a central processing unit (CPU) 402 that processes data stored in memory 404 exchanged via system bus 406. Memory 404 typically includes read-only memory, such as a built-in operating system, and random-access memory, which may include an operating system, application programs, and program data. Computer system 400 also comprises an external memory interface 408 to exchange data with a DVD or CD-ROM for example. Further, input interface 410 may serve to receive input from user input devices including but not limited to a keyboard and a mouse. Network interface 412 may allow external data exchange with a local area network (LAN) or other network, including the internet. Computer system 400 also typically comprises a video interface 414 for displaying information to a user via a monitor 416. An output peripheral interface 418 may output computational results and other information to output devices including but not limited to a printer 420.

Computer system 400 may comprise for example a personal computer or an engineering workstation, each of which is widely known in the art and is commonly used for integrated circuit design tasks, along with software products commercially available for performing computer-aided integrated circuit design tasks. Computer system 400 may also comprise a mobile computer, including for example a tablet computer or a smart phone. The computer system of FIG. 4 may for example receive program instructions, whether from existing software products or from embodiments of the present invention, via a computer program product and/or a network link to an external site.

For purposes of explanation, specific nomenclature is set forth to provide a thorough understanding of the present invention. Description of specific applications and methods are provided only as examples. Various modifications to embodiments will be readily apparent to those skilled in the art and the general principles defined herein may be applied to other embodiments and applications without departing from the spirit and scope of the invention. Thus the present invention is not intended to be limited to the embodiments shown, but is to be accorded the widest scope consistent with the principles and steps disclosed herein.

As used herein, the terms "a" or "an" shall mean one or more than one. The term "plurality" shall mean two or more than two. The term "another" is defined as a second or more. The terms "including" and/or "having" are open ended (e.g., comprising). Reference throughout this document to "one embodiment", "certain embodiments", "an embodiment" or similar term means that a particular feature, structure, or characteristic described in connection with the embodiment is included in at least one embodiment. Thus, the appearances of such phrases in various places throughout this specification are not necessarily all referring to the same embodiment. Furthermore, the particular features, structures, or characteristics may be combined in any suitable manner on one or more embodiments without limitation. The term "or" as used herein is to be interpreted as inclusive or meaning any one or any combination. Therefore, "A, B or C" means "any of the following: A; B; C; A and B; A and C; B and C; A, B and C". An exception to this definition will occur only when a combination of elements, functions, steps or acts are in some way inherently mutually exclusive.

In accordance with the practices of persons skilled in the art of computer programming, embodiments are described with reference to operations that may be performed by a computer system or a like electronic system. Such operations are sometimes referred to as being computer-executed. It will be appreciated that operations that are symbolically represented include the manipulation by a processor, such as a central processing unit, of electrical signals representing data bits and the maintenance of data bits at memory locations, such as in system memory, as well as other processing of signals. The memory locations where data bits are maintained are physical locations that have particular electrical, magnetic, optical, or organic properties corresponding to the data bits.

When implemented in software, the elements of embodiments may serve as the code segments directing a computing device to perform the necessary tasks. The non-transitory code segments may be stored in a processor readable medium or computer readable medium, which may include any medium that may store or transfer information. Examples of such media include an electronic circuit, a semiconductor memory device, a read-only memory (ROM), a flash memory or other non-volatile memory, a floppy diskette, a CD-ROM, an optical disk, a hard disk, a fiber optic medium, etc. User input may include any combination of a keyboard, mouse, touch screen, voice command input, etc. User input may similarly be used to direct a browser application executing on a user's computing device to one or more network resources, such as web pages, from which computing resources may be accessed.

While particular embodiments of the present invention have been described, it is to be understood that various different modifications within the scope and spirit of the invention are possible. The invention is limited only by the scope of the appended claims.

What is claimed is:

1. A processor-implemented method for verifying an integrated circuit yield with a predetermined confidence level while requiring fewer statistical samples, the method comprising:
   using a processor:
   creating an initial performance model of an integrated circuit design using an initial set of simulated statistical samples of design instances of the integrated circuit design;
   estimating a failure probability of each of a number of remaining statistical samples of the design instances using the initial performance model, wherein a cost function estimates the failure probability;
   simulating each remaining statistical sample in decreasing failure probability order using a computer-operated circuit simulation tool;
   selectively halting the simulating when, for a particular simulation, a comparison of the yield with a target yield becomes significant at the predetermined confidence level; and
   tangibly outputting results of the yield comparison.

2. The method of claim 1 wherein the initial performance model describes the integrated circuit design as a number of design specifications, each approximated by a model that is dependent upon a number of statistical parameters plus a random error term modeled by a normal distribution.

3. The method of claim 2 further comprising estimating a standard deviation of each random error term by cross-validation.

4. The method of claim 2 wherein creating the initial performance model comprises:
   partitioning the initial set of samples into a set of small groups for separate group standard deviation estimation; and fitting a regression model using a selectively increasing number of the initial set of samples until one of sufficient performance model accuracy is achieved and all the initial set of samples are used.

5. The method of claim 4 further comprising selectively increasing the nonlinearity of the regression model to achieve sufficient performance model accuracy.

6. The method of claim 1 wherein a logarithmic cost function estimates the failure probability to minimize numerical representational error.

7. The method of claim 1 wherein the cost function compares probability values in terms of standard deviations.

8. A non-transitory computer readable medium storing instructions that, when executed by a processor, perform a method for verifying an integrated circuit yield with a predetermined confidence level while requiring fewer statistical samples, the processor-implemented method comprising:
   creating an initial performance model of an integrated circuit design using an initial set of simulated statistical samples of design instances of the integrated circuit design;
   estimating a failure probability of each of a number of remaining statistical samples of the design instances using the initial performance model, wherein a cost function estimates the failure probability;
   simulating each remaining statistical sample in decreasing failure probability order using a computer-operated circuit simulation tool;
   selectively halting the simulating when, for a particular simulation, a comparison of the yield with a target yield becomes significant at the predetermined confidence level; and
   tangibly outputting results of the yield comparison.

9. The medium of claim 8 wherein the initial performance model describes the integrated circuit design as a number of design specifications, each approximated by a model that is dependent upon a number of statistical parameters plus a random error term modeled by a normal distribution.

10. The medium of claim 9 further comprising instructions for estimating a standard deviation of each random error term by cross-validation.

11. The medium of claim 9 wherein the instructions for creating the initial performance model comprise instructions for:
   partitioning the initial set of samples into a set of small groups for separate group standard deviation estimation; and
   fitting a regression model using a selectively increasing number of the initial set of samples until one of sufficient performance model accuracy is achieved and all the initial set of samples are used.

12. The medium of claim 11 further comprising instructions for selectively increasing the nonlinearity of the regression model to achieve the sufficient performance model accuracy.

13. The medium of claim 8 wherein a logarithmic cost function estimates the failure probability to minimize numerical representational error.

14. The medium of claim 8 wherein the cost function compares probability values in terms of standard deviations.

15. A system for verifying an integrated circuit yield with a predetermined confidence level while requiring fewer statistical samples, comprising:
   a memory storing executable instructions; and
   a processor executing instructions to:
      create an initial performance model of an integrated circuit design using an initial set of simulated statistical samples of design instances of the integrated circuit design;
      estimate a failure probability of each of a number of remaining statistical samples of the design instances using the initial performance model, wherein a cost function estimates the failure probability;
      simulate each remaining statistical sample in decreasing failure probability order using a computer-operated circuit simulation tool;
      selectively halt the simulating when, for a particular simulation, a comparison of the yield with a target yield becomes significant at the predetermined confidence level; and
      tangibly output results of the yield comparison.

16. The system of claim 15 wherein the initial performance model describes the integrated circuit design as a number of design specifications, each approximated by a model that is dependent upon a number of statistical parameters plus a random error term modeled by a normal distribution.

17. The system of claim 16 further comprising instructions to estimate a standard deviation of each random error term by cross-validation.

18. The system of claim 16 wherein the instructions for creating the initial performance model comprise instructions to:
   partition the initial set of samples into a set of small groups for separate group standard deviation estimation; and
   fit a regression model using a selectively increasing number of the initial set of samples until one of sufficient performance model accuracy is achieved and all the initial set of samples are used.

19. The system of claim 18 further comprising instructions to selectively increase the nonlinearity of the regression model to achieve the sufficient performance model accuracy.

20. The system of claim 15 wherein a logarithmic cost function estimates the failure probability to minimize numerical representational error.

* * * * *